United States Patent [19]

Lewis

[11] Patent Number: 5,555,119
[45] Date of Patent: Sep. 10, 1996

[54] DIGITAL SAMPLING OF INDIVIDUAL PULSES

[75] Inventor: Meirion F. Lewis, Malvern, United Kingdom

[73] Assignee: The Secretary of State of Defence in Her Britannic Majesty's Government of the United Kingdom of Great Britain and Northern Ireland, a British Corporation Sole, Whitehall, Great Britain

[21] Appl. No.: 244,929

[22] PCT Filed: Dec. 14, 1992

[86] PCT No.: PCT/GB92/02318

§ 371 Date: Jul. 6, 1994

§ 102(e) Date: Jul. 6, 1994

[87] PCT Pub. No.: WO93/13427

PCT Pub. Date: Jul. 8, 1993

[30] Foreign Application Priority Data

Dec. 20, 1991 [GB] United Kingdom ............... 9127057.9

[51] Int. Cl.⁶ ........................... H04B 10/04; H04B 10/06
[52] U.S. Cl. ........................ 359/158; 359/140; 359/161; 359/181; 359/189
[58] Field of Search ................................. 359/140, 158, 359/161, 173, 180, 188, 189, 195

[56] References Cited

U.S. PATENT DOCUMENTS 3,838,278  9/1974  Duguay .................... 359/140
3,849,604  11/1974  Benes ..................... 359/140
4,495,656  1/1985  Shaw ...................... 359/140
5,115,428  5/1992  Ramanan ................... 359/140
5,402,256  3/1995  Spanke .................... 359/140

FOREIGN PATENT DOCUMENTS 0090443  5/1985  Japan .................... 359/140
0269595  11/1987  Japan .................... 359/140

OTHER PUBLICATIONS

Kagan, "Time Multiplexing System" IBM Technical Disclosure Bulletin vol. 13 No. 9 p. 2484, Feb. 1971.

*Primary Examiner*—Leslie Pascal
*Attorney, Agent, or Firm*—Nixon & Vanderhye P.C.

[57] ABSTRACT

A device and a process for enabling an incident wide bandwidth (greater than about 1 GHz) short duration (less than about 10 microseconds) individual pulse of electromagnetic radiation to be digitally sampled at a sampling rate that is achievable by available digital sampling circuits. The incident pulse is modulated onto an optical signal to form a modulated optical signal and the whole, or successive or randomly selected parts, of the modulated optical signal are replicated using optical time delay means. The resulting plurality of modulated optical signal representations of the whole or parts of the incident pulse can then be digitally sampled at a sampling rate which is reduced in proportion to the number of replications to obtain a complete digital representation of the incident pulse.

24 Claims, 7 Drawing Sheets

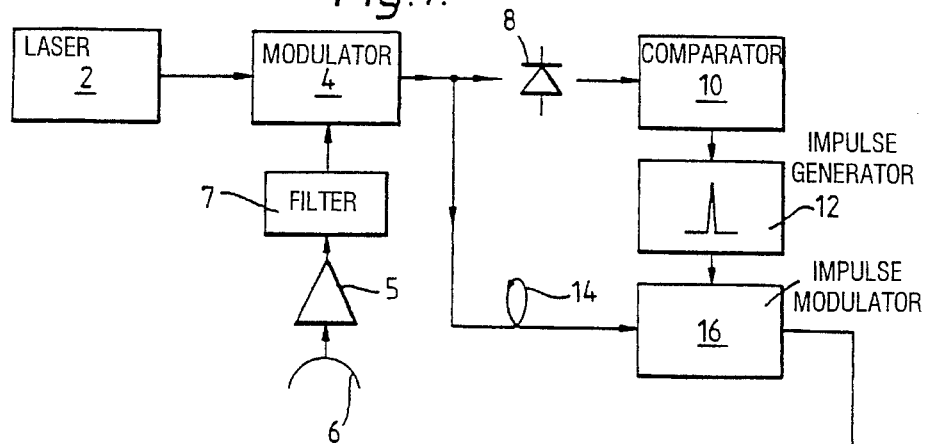
Fig.1.
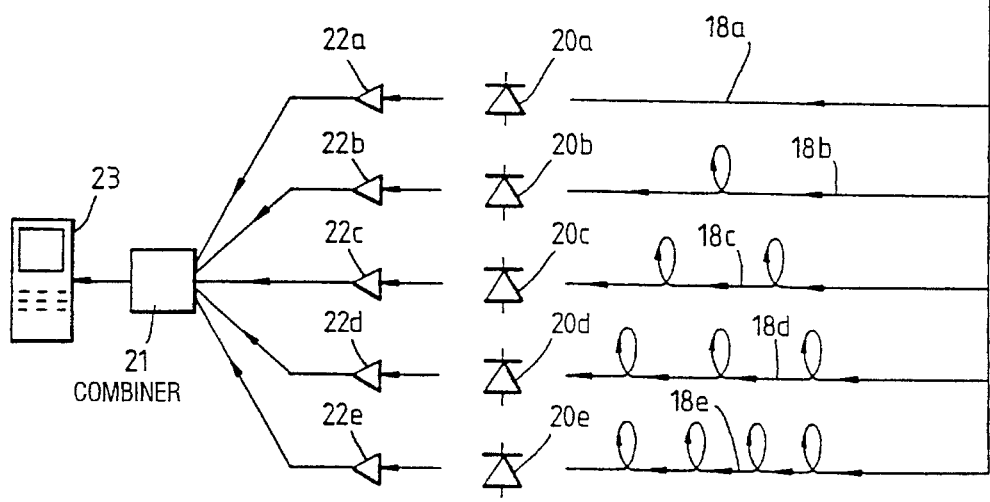
Fig.2a.
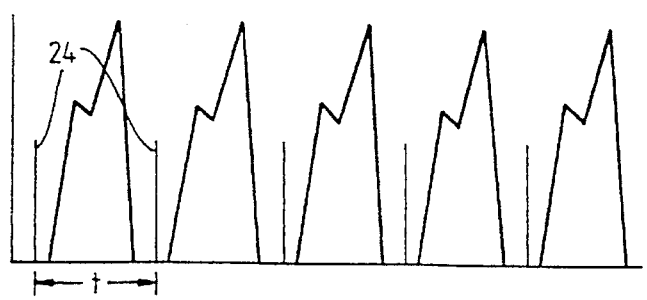
Fig.2b.

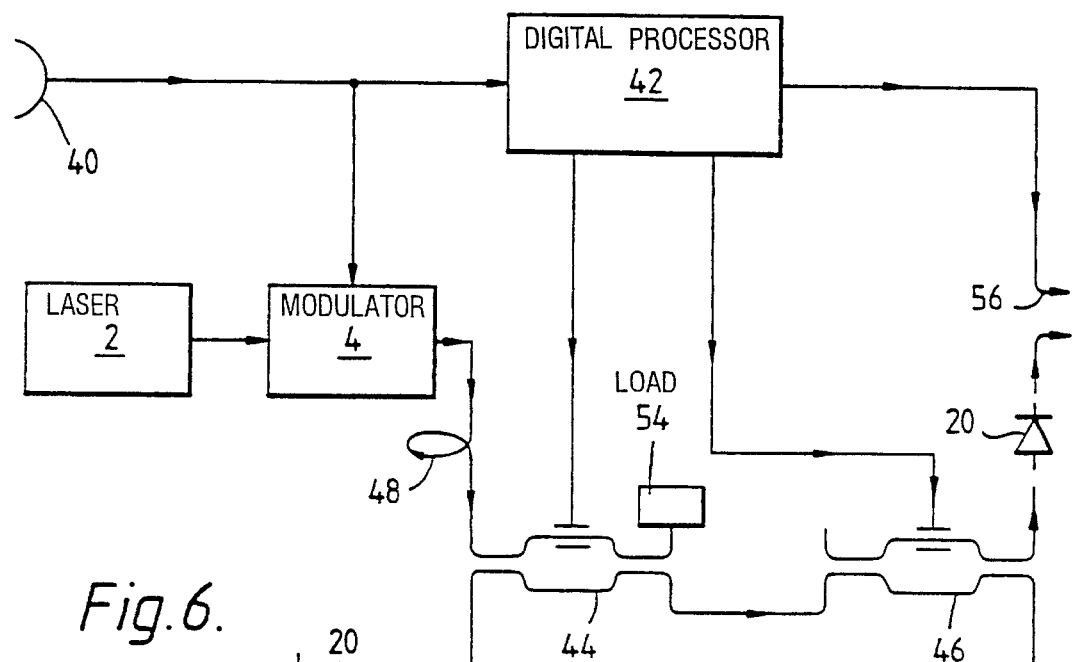
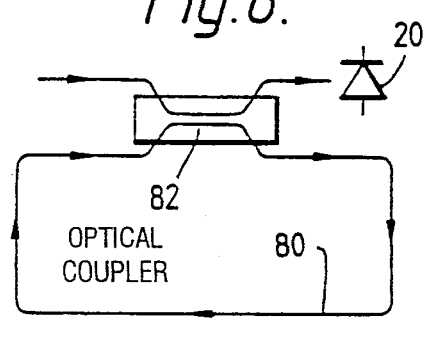
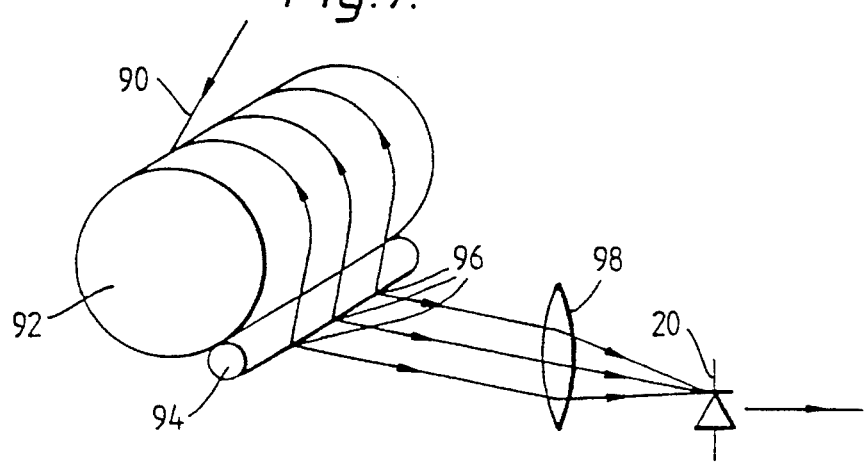

DIGITAL SAMPLING OF INDIVIDUAL PULSES

BACKGROUND OF THE INVENTION

1. Field of the Invention

This invention relates to a device for converting incident wide bandwidth short duration individual pulses of electro-magnetic radiation, in particular individual pulses with bandwidths greater than 1 GHz and durations of an order of or less than 10 microseconds, into forms that can be more readily digitally sampled.

2. Discussion of Prior Art

Digital sampling of an analogue signal usually employs analogue-to-digital convertors (ADCs) and is performed to obtain a digital record of the signal, in a form suitable for storage, analysis, manipulation by computer or display on a digital oscilloscope, etc. For an analogue signal of bandwidth B to be sampled sufficiently, ie. so that the analogue signal can be reproduced from the digital record without distortion, the sampling rate should be equal to or exceed the Nyquist sampling rate of 2 B. For signals of low bandwidth, for example, audio signals it is not difficult to sample a waveform continuously at the required rate, which is of the order of 10 kHz. The ADCs used for such tasks may be of the "successive approximation" type, which provide great accuracy at low sampling rates. For wider bandwidth signals, which require higher sampling rates, it becomes necessary to use the more complicated and expensive "flash convertor" technology in which the incoming signal is compared with many reference voltages in parallel. For pulses whose bandwidth is greater than around 1 GHz there are no ADCs available at the present time which can operate at the required sampling rate.

For repetitive pulses with bandwidths greater than 1 GHz it is possible to obtain a digital record of a single pulse by taking successive or quasi-random samples on successive pulses at a sampling rate lower than 2 B in order to eventually build up a replica of the repeated pulse. This is a procedure which is commonly used in commercial measurement equipment, for example, digital oscilloscopes. However, this does not solve the problem of sampling an individual, short duration pulse with a bandwidth greater than 1 GHz which must be digitised in a single acquisition cycle.

The developers of digital oscilloscopes have attempted to tackle this problem by conducting research to produce faster sampling methods, ie. faster ADCs. However, this approach incurs large development costs and leads to state of the art hardware being used which naturally is very expensive. This research has enabled (at the present time) sampling rates of up to around one gigasample per second to be achieved, but at an accuracy of only a few bits. A sampling rate of one gigasample per second is still not great enough to digitally sample the short duration large bandwidth individual pulses discussed above.

SUMMARY OF THE INVENTION

The present invention seeks to overcome at least some of the aformentioned disadvantages by providing a device that is able to convert wide bandwidth, short duration individual pulses of electro-magnetic radiation into a form that can be digitally sampled by available digital sampling means.

According to the first aspect of the present invention there is provided a device for converting wide bandwidth short duration individual pulses of electro-magnetic radiation into a form that can be more readily digitally sampled comprising, a source of optical radiation, a receiving means for receiving the pulse and relaying it to a modulating means which modulates the optical radiation with the pulse to form a modulated optical signal, and an optical time delay means for time delaying at least parts of the modulated optical signal by a plurality of incremental time delays, to produce outputs from the optical time delay means which comprise a plurality of modulated optical signals delayed in time with respect to one another and each substantially identical in profile to at least part of the incident individual pulse.

In the device according to the present invention the whole of the wide bandwidth short duration individual pulse that is received by the receiving means is modulated onto the optical radiation to form the modulated optical signal. In many applications the time at which the pulse is received by the receiving means will not be known beforehand and so generally the source of optical radiation will be a continuous source as opposed to a pulsed source to ensure that any incident pulse is "caught" by the present device.

The device according to the present invention produces a plurality of modulated optical signals which each comprise a faithful representation of the entire incident individual pulse or which comprise a faithful representation of successively or randomly selected portions of the incident pulse. By the term "portion of the incident pulse" is meant a section in time, for example, for a pulse of duration 10 ns a relevant portion could be a representation of the pulse between 3 ns and 4 ns from the beginning of the pulse. Clearly, the device will only work if all portions of the signal are selected eventually. It will be clear to the person skilled in the art that the modulated optical signals will have to be converted into electrical form by a converting means before they can be digitally sampled by a digital sampling means. The rate at which a digital sampling means will have to sample the electrical signals in order to obtain an accurate digital record of the solitary pulse is reduced proportionally to the number of modulated optical signals that can be sampled and so available ADCs can be used.

If the time differences between successive incremental time delays are shorter than the duration of the incident pulse then it is not possible to combine the plurality of modulated optical signals output from the optical time delay means (or the electrical signals derived therefrom) to form one composite signal without the signals interfering with one another. If the signals interfere then the signals that the sampling means samples will not comprise faithful representations of the incident pulse. In this situation it may be necessary to use one sampling circuit for each output signal and so the digital sampling means will comprise a plurality of sampling circuits. A disadvantage of this approach is that sampling circuits are expensive and consume a lot of power. However, for pulses of duration greater than around 1 micro-second it may be necessary to take this approach because it is not practical to produce differences between successive incremental time delays which are longer than around 1 micro-second. It may be possible, however to reduce the number of digital sampling circuits used, by combining the plurality of modulated optical signals (or the electrical signals derived therefrom) to form two or more composite signals each of which can be sampled by an associated sampling circuit.

Preferably the differences between successive incremental time delays are greater than the duration of the incident individual pulse. This allows sampling by a single sampling circuit as explained above because the outputs of the optical time delay means will comprise a plurality of modulated optical signals separated in time from one another that can be combined to form a single composite signal.

In a preferred embodiment of the present invention the optical time delay means comprises a plurality of optical fibres of different incremental lengths and a coupling means for directing the modulated optical signal into the input ends of every fibre so that they are all illuminated by the signal. More preferably the coupling means is arranged so that the input ends of the fibres are substantially equally illuminated by the modulated optical signal. The coupling means could, for example, be a convex lens or an integrated optic splitter. Clearly the longer an optical fibre is the longer it will take for the modulated optical signal to emerge from the output end of the fibre. Thus the outputs of the plurality of optical fibres will comprise a plurality of modulated optical signals each substantially identical in profile to the incident individual pulse and time delayed relative to one another.

In order to offset splitter loss when the modulated optical signal is split, it may be necessary to first amplify the modulated optical signal using an optical amplifier. Alternatively the plurality of modulated optical signals may be amplified by a corresponding plurality of optical amplifiers after the split. It is preferable to amplify the modulated optical signal before it is split because this requires only one optical amplifier and optical amplifiers can be expensive.

Where a large number of modulated optical signals have to be generated, for example, of the order of 100 signals or more, two or more pluralities of optical fibres can be arranged in series and a first coupling means directs the modulated optical signal into every input end of the first plurality of optical fibres and further coupling means direct into every input end of successive pluralities of optical fibres the signals from every output end of the preceding plurality of optical fibres. It should be noted that in this preferred embodiment all the pluralities of fibres except the last must have differences between successive time delays that are greater than the duration of the pulse, otherwise the delayed modulated optical signals will interfere with one another. If there are two such pluralities of optical fibres, for example, the modulated optical signal is directed into the input ends of a first plurality of optical fibres of suitable incremental lengths and the signals from each of the output ends of the first plurality are directed substantially equally into each of the input ends of a second plurality of optical fibres of suitable incremental lengths. In this way, if there are n optical fibres in the first plurality and m optical fibres in the second plurality, then with a suitable choice of incremental lengths for the optical fibres it is possible to produce output signals from the output ends of the second bundle that comprises n×m repeated modulated optical signals delayed with respect to one another and each having an identical profile to the solitary pulse. This technique has been described by M. F. Lewis and C. L. West in "Novel Narrowband Fibre Optic Microwave Filter", Electronics Letters Vol.22 (1986) pp 1016–1017.

An alternative to using one or more pluralities of optical fibres as the optical time delay means is to use a recirculating loop of optical fibre with optical coupling means provided to couple the modulated optical signal into the recirculating loop and to couple at least a portion of the modulated optical signal out of the recirculating loop. The optical coupling means could comprise. for example, integrated-optic coupled-waveguide switches which could be arranged, for example, to allow the modulated optical signal to be input to the loop and to allow successive portions of the signal to be tapped out of the loop on successive circulations thereof. These successive portions can then be sampled at a rate lower than 2 B in order to obtain an accurate digital record of the solitary pulse. Other types of recirculating loops are suitable for use in the present invention, for example, the type of recirculating loop disclosed in the article entitled "All-fibre, Diode-pumped Recirculating-ring Delay Line" published in Electronics Letters, 12 May 1988, Vol. 24, No. 10, page 608. The recirculating loop disclosed in the article has an amplifier in the loop and the output coupled from the loop is a replica of the whole pulse. The main advantage of using a recirculating loop is that only one converting means will be required to convert the portions of the modulated optical signal into electrical form. However a disadvantage is that the device cannot be used to sample a successive incident pulse while the preceding modulated optical signal is still circulating in the loop.

Preferably the differences between successive incremental time delays are constant so that the outputs from the optical time delay means comprise a series of modulated optical signals (or portions of such signals) each delayed by a constant amount relative to the preceding such signal. The advantage of this is that the sampling means can be controlled by a timing means to begin the sample acquisition cycles in its sampling circuit/s at a predetermined time before the beginning of each of the modulated optical signals.

If the optical time delay means used cannot easily be arranged to have incremental differences that are constant an alternative is to add to the device a triggering means for causing an impulse to be modulated onto the optical radiation at a pre-determined time before the beginning of the modulated optical signal. In this way it is possible to provide an impulse that occurs a predetermined time before the beginning of each of the modulated optical signals output from the optical time delay means that can be used to trigger acquisition cycles in the sampling means.

It is preferable that the source of optical radiation is substantially temporally coherent to minimise dispersion of the modulated optical signal in the fibre. For the same reason the fibre will usually be single-mode and operate with a laser diode of wavelength about 1.3 microns, where dispersion is minimised. However multimode fibre may be of use for very short delays.

The source of optical radiation may be a semiconductor laser. The advantages of using a semiconductor laser as the source are that it is a relatively coherent source and the output of the semiconductor laser can be internally modulated with the individual pulse relatively cheaply and simply by using a bias tee circuit. The output of the semiconductor laser can be internally modulated with pulses which have bandwidths of up to around 10 GHz.

If the individual pulse has a bandwidth greater than 10 GHz then alternatively the output of the source of optical radiation is externally modulated using an electro-optic modulator, for example a Mach-Zendher interferometer structure on $LiNbO_3$ or III-V semiconductor substrates. Coupled waveguides could be used in place of the Y-junctions in the Mach-Zendher structure which can be more complicated but have the advantage that they are substantially lossless. If a Mach-Zendher structure is used then individual pulses with wider bandwidths of up to around 25 GHz can be modulated onto the output of the source. Another advantage of external modulation is that if the source is of high power and operated continuously the individual pulse can be amplified in the modulation process so as to offset any loss in the rest of the device. However external modulation is more complex and costly than internal modulation.

Preferably the device additionally comprises converting means for converting the modulated optical signals output from the optical time delay means into electrical signals. The device with the converting means can be fitted onto conventional digital sampling devices, for example digital oscilloscopes, in order to modify them so that they are able to sample and make an accurate digital record of wide bandwidth short duration solitary pulses. Preferably the converting means comprises one or more wide band photo-diodes. When the converting means comprises more than one detector, such as photo-diodes, the resulting electrical signals may be combined to form one or more composite signals in order to reduce the number of digital sampling circuits required.

When pluralities of optical fibres are used as the optical time delay means it may be necessary to have one photo-diode associated with each of the output ends of the optical fibres at the output of the optical time delay means. High bandwidth photo-diodes have been demonstrated up to bandwidths of at least 100 GHz. Such wide bandwidth photo-diodes have small areas on which they can detect incident light and the output of an optical fibre (which typically have diameters of around several microns) will fit well onto such a photo-diode. The outputs of the plurality of photo-diodes can be amplified and then combined, if appropriate, before being input into a digital sampling means. Although the use of many individual photo-diode detectors is undesirable because of cost and size, it is possible to buy arrays of such detectors on one substrate which may be more satisfactory. Alternatively one larger area photo-diode can be used to receive the outputs from all the output ends of the optical fibres which has the advantage that it will be cheaper and less complex. However, such larger area photo-diodes have a reduced frequency response and will not be suitable for detecting very high bandwidth signals.

The device with the converting means may additionally comprise digital sampling means, comprising one or more digital sampling circuits, for digitally sampling the electrical signals output from the converting means to form a self contained sampling device for sampling wide bandwidth short duration individual electro-magnetic pulses.

Once the modulated optical signals have been converted by the converting means into electrical signals (and combined, if appropriate), the resulting electrical signals (or signal) may be split and input into separate digital sampling circuits. According to this scheme, if there are n delayed modulated optical signals output from the optical time delay means and the electrical signals output from the converting means are split m times then m×n electrical representations of the incident pulse can be sampled by the digital sampling means. If the split electrical signals are delayed with respect to one another, by appropriate amounts, before they are input into their respective digital sampling circuits, the digital sampling circuits can be triggered simultaneously.

Where more than one digital sampling circuit is used, it may be necessary for the digital sampling circuits to take samples at different times, ie. not simultaneously, in order to sample the incident pulse sufficiently. In order to achieve this the digital sampling means may comprise a pulse generator for generating trigger pulses, a plurality of digital sampling circuits and a corresponding number of delay means for transmitting the trigger pulse to each digital sampling circuit in such a way that each digital sampling circuit is triggered by a trigger pulse at a different time. Preferably the trigger pulse is an optical pulse and the digital sampling means comprises an optical pulse generator for generating optical pulses, a plurality of digital sampling circuits and a corresponding plurality of optical fibre delay lines of different lengths for transmitting the optical pulses to the digital sampling circuits to trigger said circuits. The optical trigger pulses may be converted to electrical signals before being input into the digital sampling circuits. Alternatively the trigger pulse may be an electrical pulse generated by an electrical pulse generator.

According to the second aspect of the present invention there is provided a process for converting a wide bandwidth short duration individual pulse of electro-magnetic radiation into a form that can be more readily digitally sampled, comprising the steps of;

a) generating optical radiation, b) receiving the pulse, c) modulating the optical radiation with the pulse to form a modulated optical signal, and d) time-delaying at least parts of the modulated optical signal by a plurality of incremental time delays, to produce a plurality of modulated optical signals delayed in time with respect to one another and each having a profile identical to at least part of that of the incident individual pulse.

The process according to the second aspect of the present invention has the same advantages associated with it as the device according to the first aspect of the present invention.

Preferably the differences between successive incremental time delays are greater than the duration of the individual pulse so that the plurality of modulated optical signals (or electrical signals derived therefrom) can be combined as discussed above with reference to the first aspect of the present invention. Also the differences between successive incremental time delays are preferably constant so that a sampling means used to sample electrical signals derived from the plurality of modulated optical signals can be controlled by a timing means to begin successive acquisition cycles at appropriate times.

The process may additionally include modulating an impulse onto the optical radiation at a predetermined time before the beginning of the modulated optical signal. The impulse is replicated with the modulated optical signal and provides a trigger pulse for digital sampling means.

The process according to the second aspect of the present invention may additionally include the step of;

e) converting the modulated optical signals output from the time delay means into electrical signals.

The process according to the second aspect of the present invention may also include the step of;

f) digitally sampling the electrical signals.

The electrical signals may be split and the resulting plurality of electrical signals digitally sampled separately in order to further increase the number of electrical signal representations of the incident pulse that are sampled, further reducing the required sampling rate.

BRIEF DESCRIPTION OF THE DRAWINGS

Embodiments of the present invention will now be described by way of example only with reference to the accompanying drawings in which:

FIG. 1 is a schematic representation of a first embodiment of the present invention in which the optical time delay means comprises a bundle of optical fibres of differing lengths.

FIG. 2a is a graph of amplitude against time of a wide bandwidth short duration individual pulse.

FIG. 2b is a graph of amplitude against time of the electrical signal which is input into the digital sampling means of the device in FIG. 1 when the pulse in FIG. 2a is received by the receiving means of the device in FIG. 1.

FIG. 5 is a schematic representation of a fourth embodiment of the present invention in which the optical time delay means comprises a recirculating loop which couples successive portions of the modulated optical signal out of the loop on successive circulations.

FIG. 6 is a schematic representation of the optical time delay means according to a fifth embodiment of the present invention in which the optical time delay means is a recirculating loop which couples a representation of the entire modulated optical signal out of the loop on successive circulations.

FIG. 7 is a schematic representation of the optical time delay means according to a sixth embodiment of the present invention in which the optical time delay mean comprises a tapped optical fibre.

FIG. 9c is a schematic representation of the combined samples of the electrical signal taken by the apparatus in FIG. 9a.

DETAILED DISCUSSION OF PREFERRED EMBODIMENTS

Figure 3:
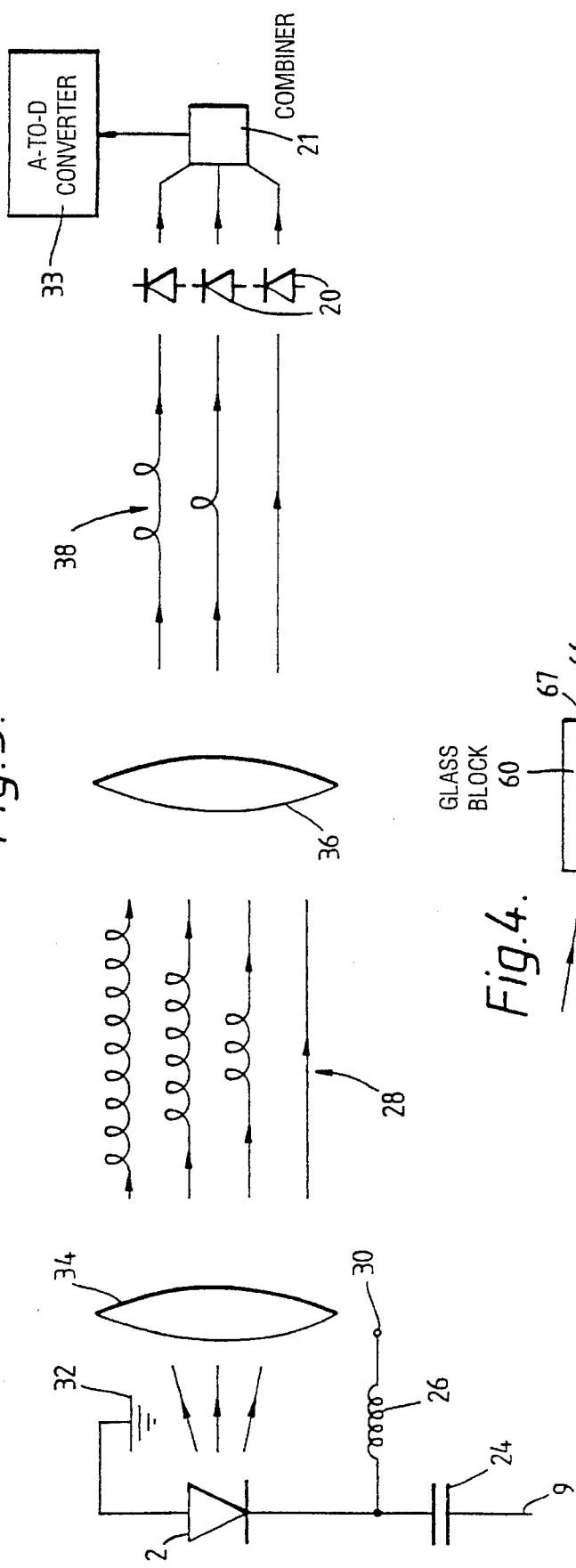
FIG. 3 is a schematic representation of a second embodiment of the present invention in which the optical time delay means comprises two bundles of optical fibres of differing lengths arranged in series.

The device shown in FIG. 1 comprises a laser 2, which can be, for example a laser diode. The light emitted by the laser 2 is directed through an external modulator 4, for example, a Mach-Zendher interferometer structure on an $LiNbO_3$ or III-V semiconductor substrate. The individual pulse will generally be a radio frequency signal which is received by an antenna 6 and amplified by a wideband amplifier 5 and filtered appropriately by a suitable filter 7 to produce a voltage representation of the individual pulse that is applied across one arm of the Mach-Zendher interferometer 4 to modulate the laser light. Therefore the light that is emitted from the external modulator 4 carries the incident individual pulse in the form of radio frequency amplitude modulation.

The light emitted from the external modulator is split and directed into an electro-optic detector 8 and into an impulse modulator 16 via an optical fibre delay loop 14. The detector 8 can be, for example, a photo-diode. The detector 8 converts the optical signal incident on it into an electrical signal which is fed into a comparator 10, which compares the electrical signal with a pre-determined threshold level. The threshold level is set so that when a modulated optical signal is received by the detector 8 the electrical signal input into the comparator 10 exceeds the threshold level. When the threshold level is exceeded the comparator 10 outputs a signal to an impulse generator 12 which generates a short duration impulse. This impulse is then input into the impulse modulator 16. The delay loop 14 delays the modulated optical signal carried by the light emitted from the external modulator 4 by a pre-determined amount so that the impulse is modulated onto the said light signal by the impulse modulator 16 in an accurately determined position before the beginning of the modulated optical signal.

In a variation to this embodiment (not shown) the input signal from the antenna 6 is fed directly into the comparator 10.

The modulated signal and the impulse emitted by the impulse modulator 16 are split equally into the optical fibre delay lines 18a to 18e which comprise optical fibres of differing lengths. It may be necessary to amplify the modulated signal using an optical amplifier (not shown) before it is split into the delay lines 18a to 18e. The nth fibre delay line has a length $L_n$ (n goes from 1 to 5) and the time delay in the nth fibre, $t_n$, is related to the length of the fibre by the equation $$L_n = ct_n$$

where c is the velocity of light in the fibre. The time delays, $t_n$, are given by the equation $$t_n = t_1 + (n-1)t$$

where $t_1$ is the delay along the shortest fibre 18a, t is the incremental time delay. In this embodiment t is greater than the duration of the incident solitary pulse and so the combined output of the fibres 18a to 18e will be 5 repeated modulated optical signals separated in time from one another and each identical in profile to the original solitary pulse.

The light signals emitted by each of the optical delay lines 18a to 18e are directed onto respective high-speed photo-diodes 20a to 20e. The electrical signals output from the photo-diodes 20a to 20e are then amplified by respective amplifiers 22a to 22e and combined at 21 before being input into a digital oscilloscope 23. For narrower bandwidth signals it may be possible to combine detectors 20a to 20e into one large-area detector. Alternatively 20a to 20e could be one detector array rather than separate detectors.

In FIG. 1, as described above, the sampling means is a digital oscilloscope and the other components of the device shown in FIG. 1 can be incorporated into a single piece of equipment that can be fitted optionally onto digital oscilloscopes. In this way conventional digital oscilloscopes can be modified to detect wide bandwidth short duration solitary pulses of optical electro-magnetic radiation. An alternative way to use the digital samples is to feed them into a digital computer for digital processing, eg. by comparison with known waveforms.

In operation when an individual pulse of the form shown in FIG. 2a is received by the aerial 6 the combined output that is input into the digital oscilloscope 23 is of the form shown in FIG. 2b. The pulse shown in FIG. 2a is schematic because the pulse would arrive at the aerial 6 through air and so would not be a direct current pulse, it would have no direct current component. The output in FIG. 2b comprises 5 repeated signals having substantially the same profile as the original solitary pulse and the time delay between successive signals is t, the incremental delay. The impulses denoted by 24 are replicas of the impulse modulated onto the laser light by the impulse modulator 16. The time delay between each impulse 24 and the following repeated signal is very accurate and so the impulses 24 can be used to trigger the digital oscilloscope 23, ie. tell it to begin an acquisition cycle. Therefore the digital oscilloscope 23 is able to sample 5 replicas of the individual pulse instead of only 1 and so the sampling rate at which it is required to work in order to record the profile of the solitary pulse sufficiently is reduced by approximately five times. The digital samples obtained can be stored and processed to obtain a digital representation of the individual pulse.

Errors in the apparatus shown in FIG. 1 can be easily calibrated out, by inputting a pulse of known characteristics into the apparatus and arranging the digital oscilloscope 23 to store any differences in the amplitudes of the repeated signals it receives. Then when the apparatus is recording signals with unknown characteristics the oscilloscope 23 can compensate for the errors in the apparatus. Such errors could arise, for example from the unequal illumination of the delay lines 18a to 18e.

Referring now to FIG. 3, a radio frequency signal is received by an antenna (not shown) and amplified by a wideband amplifier (not shown) and filtered by a suitable filter (not shown) and the resulting electrical signal is input at point 9. The electrical signal internally modulates the output of a laser diode 2 via a bias tee circuit comprising a capacitor 24, an inductor 26, a negative bias voltage supply 30 and an earth point 32. The light emitted by the laser diode 2 is incident on a first lens 34 (although in certain circumstances the first lens 34 can be dispensed with). The laser diode, first lens (if used) and first bundle 28 are so positioned that the input ends of the first bundle 28 are fully illuminated with the fibres of the bundle receiving similar (ideally equal) light intensities. The fibres in the bundle 28 have different lengths $L_{n1}$ (where n1 goes from 1 to 4) corresponding to time delays $t_{n1}$ given by the equation $$t_{n1}=t_1+3(n-1)t$$

where t is greater than the duration of the incident solitary pulse. The outputs of each of the fibres of the first bundle 28 are coupled equally strongly into each of the fibres of a second bundle 38 using a second lens 36 in its Fourier Transform mode. The second lens 36 is most preferably a graded index lens because it is compact and the fibre optic bundles can be exposed directly to it, so avoiding Fresnel reflections and free space propagation. The fibres in the bundle 38 have different lengths $L_{n2}$ (where n2 goes from 1 to 3) corresponding to time delays $t_{n2}$ given by the equation $$t_{n2}=t_1+(n-1)t.$$

The combination of the bundles 28 and 38 in series results in time delays given by the equation $$t_n=t_1+(n-1)t$$

where n goes from 1 to 12. Therefore the combined output of the second bundle of fibres 38 will comprise 12 repeated signals separated in time from one another and each identical in profile to the original solitary pulse and separated in time by delays equal to t. The outputs of the bundle of fibres 38 are directed into wide bandwidth photo-diodes 20 and are then combined at 21 and input into an ADC 33.

Using two bundles of optical fibres the first comprising Y fibres and the second comprising Z fibres in series as described above results in Y×Z delayed signals being output from the second bundle of fibres whereas using a single bundle of Y+Z fibres results in only Y+Z delayed signals being output from the fibres. In FIG. 3 it is assumed that all incremental delays exceed the duration of the received individual pulse. As in FIG. 1 a trigger pulse can be added if desired by means of additional components (not shown) between the laser diode 2 and the lens 34.

Referring now to FIG. 5, the optical time delay means comprises a recirculating loop of optical fibre denoted generally by 50. Laser light is coupled into the loop 50 by an electrically controlled optical switch 44 and is coupled out of the loop 50 by an electrically controlled optical switch 46. The optical switches can be, for example integrated optic coupled waveguide interferometers, which are shown in FIG. 5 schematically. The optical switches are controlled by a digital processor 42.

In operation, an antenna 40 receives an individual electrical pulse. This electrical signal is input both into a digital processor 42 and an external modulator 4, for example, a Mach-Zendher interferometer. The light emitted from a laser 2 is modulated with the electrical signal in the external modulator 4 and so carries the solitary pulse as intensity modulation at the radio frequency. The digital processor 42, which contains a precision clock, is triggered by the incoming signal. The modulated optical signal output from the external modulator 4 is delayed for a predetermined time in a delay loop 48 of optical fibre. When an individual pulse is received by the digital processor 42, the processor causes the optical switch 44 to open when the modulated optical signal, delayed by the loop 48, approaches the optical switch 44 so that the modulated optical signal is coupled into the loop 50. The processor 42 closes the optical switch 44 directly after the modulated optical signal has been coupled into the loop 50. The modulated signal coupled into the loop 50 circulates around the loop 50 as indicated by the arrows. An amplifier 52 can be placed in the loop 50 to amplify the modulated optical signal. The optical switch 46 is also controlled by the digital processor 42 which causes it to open as the modulated optical signal passes through it on successive circulations in order to couple out of the loop 50 successive portions of the modulated optical signal. Once all the portions of the modulated optical signal have been coupled out of the loop 50 any circulating signal remaining in the loop 50 can be dumped into the load 54 and then the device is ready to receive another incident solitary signal. The optical output of the switch 46 is converted to an electrical signal by the wide-bandwidth photo-diode 20 and the electrical signal can then be fed into a digital sampling means (not shown). The output 56 from the digital processor 42 can be used to trigger acquisition cycles in the digital sampling means at the correct times. In a variation to this embodiment (not shown), a precision pulse is added before the signal, as is described above with reference to FIG. 1.

Referring now to FIGS. 8a to 8f, FIG. 8a represents a modulated optical signal that is coupled into the loop 50 by the optical switch 44. If the timing of the optical switch 46 is arranged to couple successive portions of the modulated signal out of the loop 50 which are a sixth of the whole modulated signal then FIGS. 8b to 8f represent the portions of the signal remaining in the loop 50 after successive passes of the switch 46. FIGS. 8a to 8f are schematic representations of the modulated optical signal only, as the pulse would normally not have a direct current component.

Figure 4:
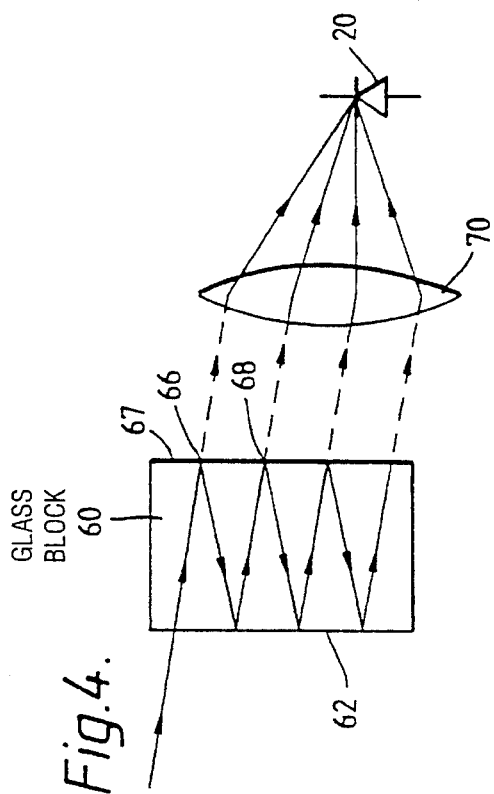
FIG. 4 is a schematic representation of the optical time delay means according to a third embodiment of the present invention in which the optical time delay means is a glass block.
Figure 8A:
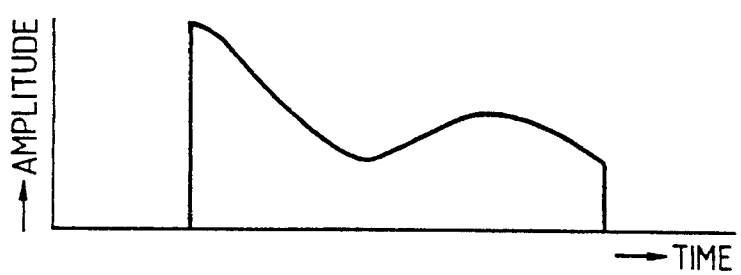
FIGS. 8a to 8f are graphs of amplitude against time of the portions of the signal remaining in the recirculating loop in FIG. 5 on successive recirculations thereof, when the modulated optical signal in FIG. 8a is coupled into the loop.
Figure 8B:
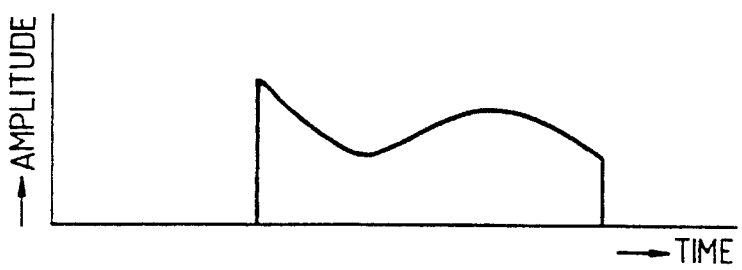
Figure 8C:
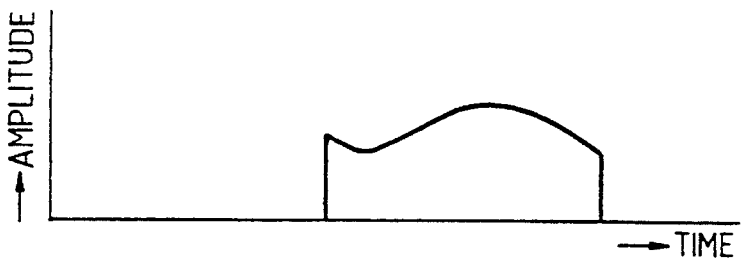
Figure 8D:
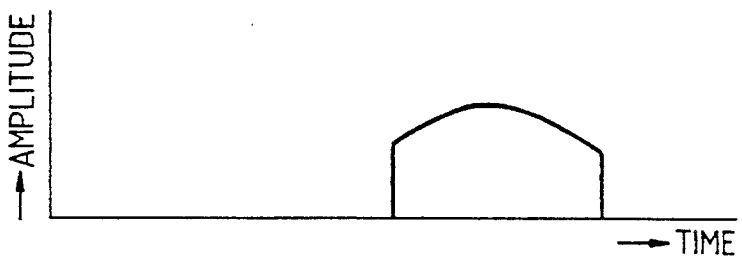
Figure 8E:
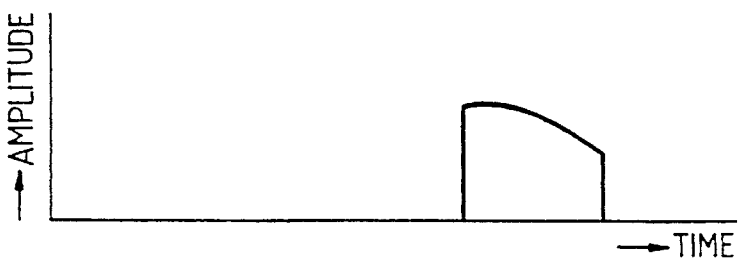
Figure 8F:
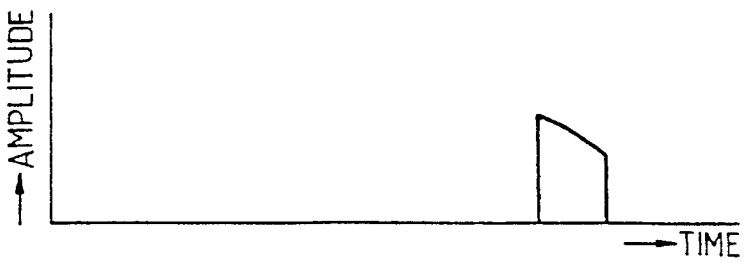

FIGS. 4,6 and 7 show alternative embodiments of the optical time delay means of the device according to the present invention.

The embodiment in FIG. 4 shows a glass block 60 coated with a reflective coating 62 and a partially reflective coating 64, but could alternatively comprise a cavity formed by two partially reflecting mirrors, for example, dielectric mirrors. The light carrying the modulated signal is directed at a shallow angle into the glass block 60 and is partially reflected and partially transmitted at point 66 by the partially reflective coating 64. The partially reflected component of the light is reflected by the coating 62 and again is partially reflected and partially transmitted by the coating 64 at point 68. This continues down the glass block 60. Each of the successive partially transmitted light beams and the pulses modulated thereon will be delayed relative to the previous beam by the length of time it takes a beam of light to travel from point 66 to point 68 through the glass block. The partially transmitted light beams are brought to a focus by a lens 70 onto a wide bandwidth photo-diode 20, the output of which can be fed to a digital sampling device. Alternatively, one photo-diode could be used for each partially transmitted light beam and the outputs of the photo-diodes could be combined if appropriate before being input to the digital sampling means.

The embodiment in FIG. 6 shows a recirculating loop 80. The modulated signal is coupled into the loop 80 by the optical coupler 82. On successive circulations past the optical coupler 82 a small percentage, for example 20 percent, of the amplitude of the entire signal will be coupled out of the loop 80. An amplifier can be located inside the loop 80 to amplify the modulated signal. The signals that are coupled from the loop will be successively delayed representations of the profile of the modulated signal coupled into the loop, the delay being determined by the time it takes the signal to circulate the loop. The modulated signals coupled from the loop 80 are converted to electrical signals that can be fed to a digital sampling device by a wide bandwidth photo-diode 20.

The embodiment in FIG. 7 shows a tapped optical fibre. A single optical fibre 90 is wrapped around a large drum 92 and a small drum 94. When the light carrying the modulated signal is directed into the fibre 90 as indicated by arrows, some of the light escapes from the fibre 90 at the points 96 because the fibre 90 curves sharply at these points. The light from each of the points 96 is delayed relative to the light from the preceding point 96 by a time delay dependant on the length of fibre between the points 96. Again the outputs from the points 96 are focussed by a 98 lens onto a wide bandwidth photo-diode 20, or on to separate detectors.

For high bandwidth pulse to be sampled sufficiently by the devices described above, the sampling rate should be equal to or exceed the Nyquist sampling rate of 2 B, where B is the bandwidth of the pulse. Therefore, if the pulse has a duration T the number of samples that should be taken equals or exceeds 2 BT samples. To sample some pulses sufficiently the number of samples that should be taken will be high and will require the modulated optical signal to be split of the order of a hundred times, for example using apparatus of the type described with reference to FIG. 3. Alternative digital sampling means of the type shown in FIG. 9a may be used to reduce the number of times the modulated optical signal must be split while still enabling the incident signal to be sampled sufficiently.

The electrical signal output from the combining means 21 of FIG. 1 comprises five electrical pulse representations of the incident pulse separated in time from each other by a time delay t as described above with reference to FIG. 2b. Assuming that 2 BT is equal to 15 (the number 15 is chosen for illustrative purposes only, in practice 2 BT could be around 100), and that each of the five electrical pulse representations of the incident pulse can only be sampled once by available digital sampling circuits, then the apparatus of FIG. 1 could take only 5 samples of the incident pulse. The apparatus in FIG. 1 can be arranged to obtain 15 samples by replacing the digital oscilloscope in FIG. 1 by the digital sampling means shown in FIG. 9a.

Figure 9A:
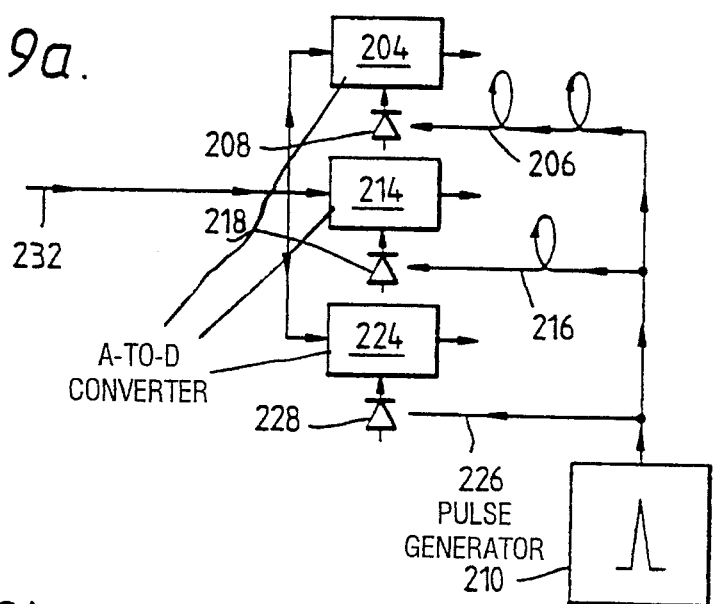
FIG. 9a is a schematic representation of an alternative digital sampling means triggered by optical pulses delayed with respect to one another by optical time delay means.

The apparatus in FIG. 9a comprises a optical pulse generator 210, optical fibre delay lines 206, 216 and 226 which each have a different length, respective photo-diodes 208, 218 and 228 and respective analogue to digital convertors 204, 214 and 224. The optical pulse generator 210 generates a train of optical pulses separated in time by equal amounts. In the present embodiment where there are 5 delayed electrical pulses of duration T, with a time delay t between them the optical pulses generated by the pulse generator 210 will be separated in time by t+T/5. In practice the duration T of the individual pulse may not be known before the pulse is received and so an estimated maximum value of duration of likely incident individual pulses should be used. The train of optical pulses from the pulse generator 210 is split into the three optical fibre delay lines 206, 216 and 226. The differential delay between the delay lines 216 and 206 and between the delay lines 226 and 206 is T/(3×5), ie. T/15, because there are 5 delayed electrical pulses of duration T and 3 convertors. The optical pulses output from delay lines 206, 216 and 226 are converted into electrical pulses in the photo-diodes 208, 218 and 228 respectively and the electrical pulses trigger the digital sampling circuits 204, 214 and 224 respectively.

The electrical signal output from the combining means 21 of FIG. 1 is input into the apparatus of FIG. 9a at point 232 and is split equally into the three analogue to digital convertors 204, 214 and 224. The digital convertors 204, 214 and 224 are triggered to sample the electrical signal by the optical pulses generated by the generator 210 and delayed by the delay lines 206, 216, 226 respectively. The electrical pulse output from the combining means 21 of FIG. 1 need not carry a trigger pulse because the digital convertors 204, 214 and 224 are triggered by the delayed optical pulses from the delay lines. Therefore, if the arrangement in FIG. 9a is used with the apparatus in FIG. 1 then items 8, 10, 12, 14 and 16 used in FIG. 1 to modulate a trigger pulse onto the modulated optical signal are not necessary.

Figure 9B:
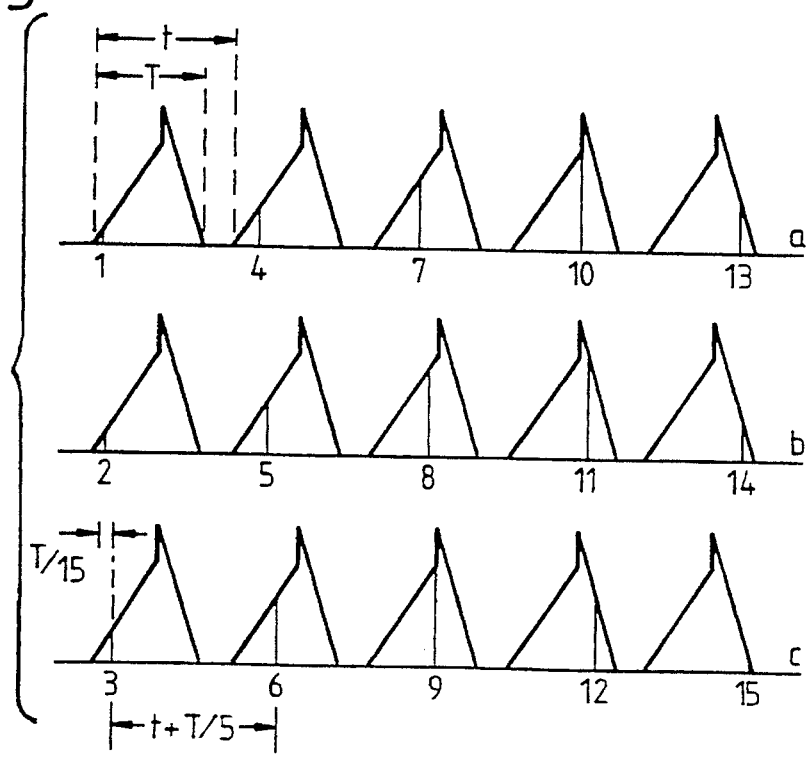
FIG. 9b is a schematic representation of the way the digital sampling means of FIG. 9a samples the electrical signal output from the converting means of the embodiment shown in FIG. 1.
Figure 9C:
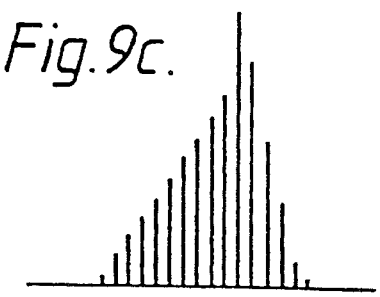

FIG. 9b and 9c show a schematic representation of the sampling of the 5 delayed electrical signals (in practice the pulses would not normally have a direct current component). The three rows of pulses a, b and c show a schematic representation of the 5 delayed electrical pulses input into the convertors 224, 214 and 204 respectively. If the convertor 224 takes sample 1 at a time T/15 after the beginning of the first pulse in row a, then it will take; sample 4 at a time T/15+T/5 after the beginning of the second pulse, sample 7 at a time T/15+2T/5 after the beginning of the third pulse, sample 10 at a time T/15+3T/5 after the beginning of the fourth pulse, and sample 13 at a time T/15+4T/5 after the beginning of the fifth pulse.

Because of the differential time delay of T/15 between delay line 216 and 226, convertor 214 will take samples of the first to fifth electrical pulse in row b at a time T/15 later than convertor 224 takes samples of the first to fifth electrical signals in row a (see samples 2, 5, 8, 11 and 14 in row b). Similarly convertor 204 takes samples of the first to fifth electrical pulses in row c at a time 2T/15 later than convertor 224 takes samples of the first to fifth electrical pulses in row a (see samples 3, 6, 9, 12 and 15). Because the train of 5 electrical pulses is input into each convertor simultaneously, between them the convertors 204, 214 and 224 take fifteen samples of the profile of the replicated electrical pulse representing the solitary pulse to be sampled at equally spaced intervals. When the samples taken by each of the convertors are combined, as shown in FIG. 9c (at twice the scale of FIG. 9b) they comprise 15 equally spaced digital samples of the electrical signal representing the input individual pulse.

In the general case when there are n replicated electrical pulses and m analogue to digital convertors arranged according to FIG. 9a then n m equally spaced digital samples of the electrical signal representing the individual pulse received by the apparatus can be obtained. This requires fewer splits of the modulated optical signal than the embodiments described with respect to FIGS. 1 to 8 and so reduces splitting losses.

Alternatively differential time delays equal to T/15 can be applied to the electrical signals input at point 232, after they are split and before they are input into the digital sampling circuits 204, 214 and 224, using electrical time delay means. The digital sampling circuits 204, 214 and 224 can then be triggered simultaneously at time intervals of t+T/5 to obtain 15 equally spaced samples of the incident pulse.

It will be apparent that the ratio of the number of signals output from the optical time delay means to the number of digital sampling circuits can be widely varied, for example, it may be useful in some circumstances to combine the outputs of the optical time delay means into two or more composite signals (as long as pulses do not interfere) so that each of the digital sampling circuits receives more than one pulse. Clearly the incremental time delay t, the number of delayed pulses produced and the number of digital sampling circuits required can be tailored to the characteristics of the pulse that the device is designed to receive.

If the plurality of optical fibres 18a to 18e in the device in FIG. 1 had differing lengths such that the incremental time delay t was less than the duration T of the incident pulse then the outputs of the fibres 18a to 18e could not be combined as described with reference to FIG. 1 because there would be interference between the electrical signals. In cases where the duration of the pulse is greater than the order of about 1 micro second it becomes impractical to produce time delays t that are greater than the duration of the pulse. This is because the amount of optical fibre required to delay the signal becomes so long that dispersion of the signals in the fibre becomes significant and the optical time delay means become large and costly. In this case more than one digital sampling circuit can be used in the sampling means.

Figure 10A:
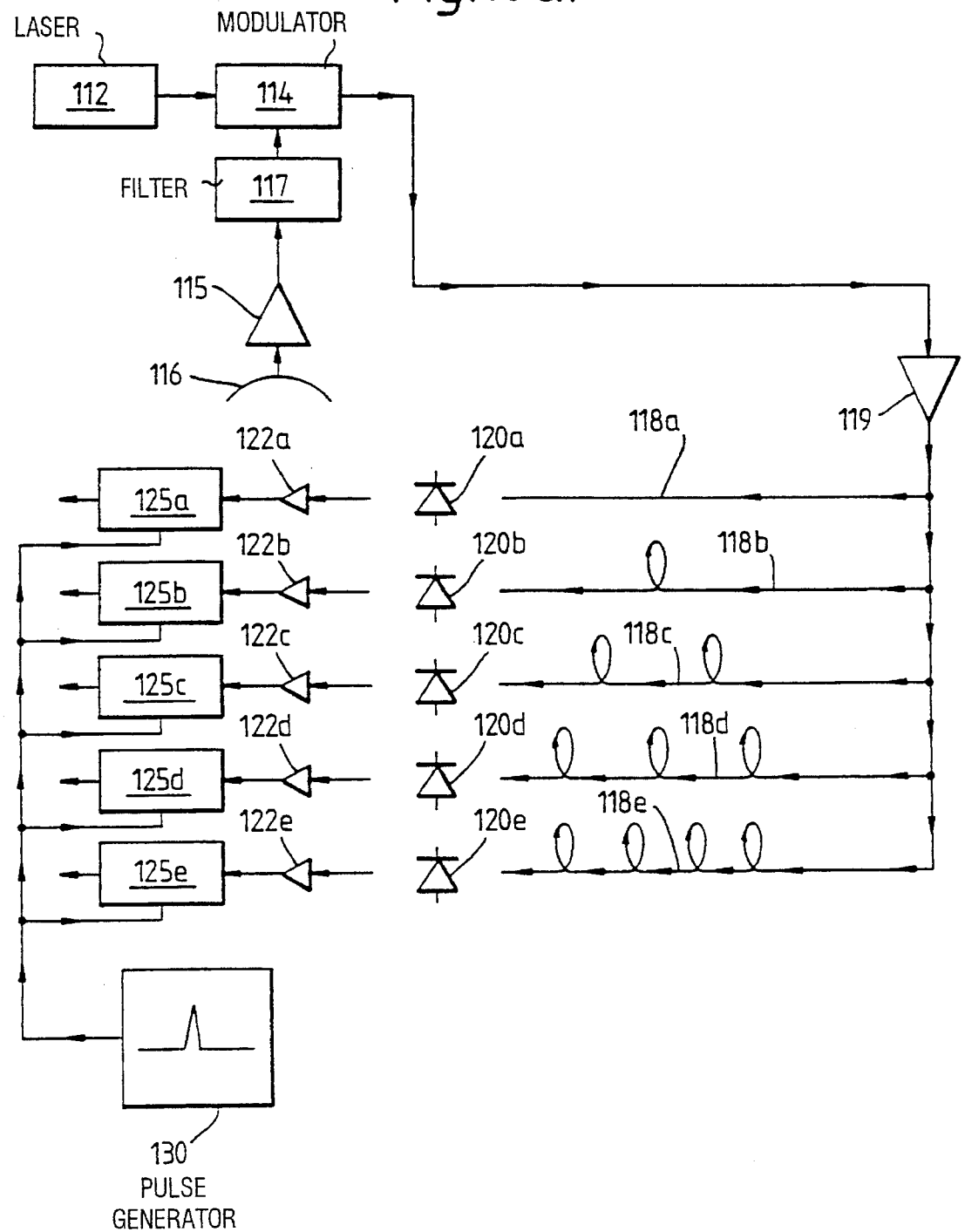
FIG. 10a is a schematic representation of a seventh embodiment of the present invention for incident individual signals with a duration of the order of 1 micro second and in which each delayed electrical signal from the convertors is input into a separate digital sampling circuit.

FIG. 10a shows an apparatus which can be used for pulses of about 1 micro second duration. It is very similar to FIG. 1, with like pieces of apparatus being indicated by like numbers but preceded with a "1". The outputs from amplifiers 122a to e are not combined, as in FIG. 1, but instead are fed into respective digital sampling circuits 125a to e. In FIG. 10a a trigger pulse is not modulated onto the laser beam at a preset time before the modulated optical signal because the sampling circuits 125a to e are triggered simultaneously by trigger pulses generated by pulse generator 130. The outputs of sampling circuits 125a to e can then be fed to a computer (not shown) for further processing.

Also in FIG. 10a optical amplifier 119 is shown which amplifies the modulated optical signal before it is split in order to reduce splitter loss.

Figure 10B:
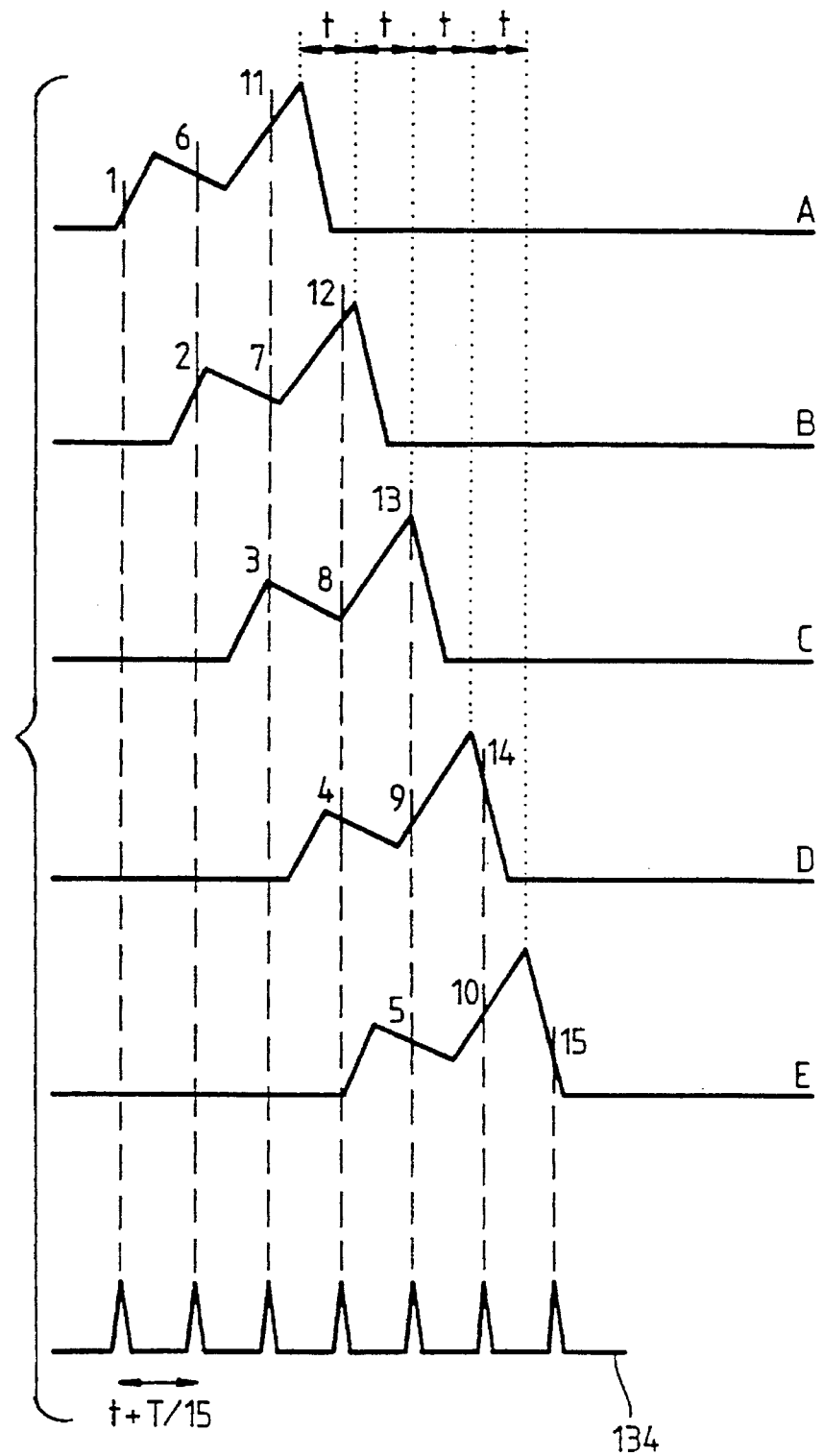
FIG. 10b is a schematic representation of the way the digital sampling means of FIG. 10a samples the electrical signals output from the converting means.

The five electrical signals output from the amplifiers 122a to 122e are represented by the signals A to E in FIG. 10b. If the pulse generator 130 generates a train of pulses 134 separated in time by t+T/15 and digital sampling circuit 125a takes sample 1 at T/15 after the beginning of the electrical pulse input into it then sampling circuit 125a will also take samples at points 6 and 11 of the pulse and sampling circuit 125b will take samples at points 2,7 and 12 etc.

I claim:

1. A device for converting wide bandwidth, short duration individual pulses of electro-magnetic radiation into a form more readily digitally sampled, said device comprising, a source of optical radiation, a receiving means for receiving a wide bandwidth, short duration pulse of magnetic radiation, a modulating means, responsive to said optical radiation and said receiving means, for modulating the optical radiation with the pulse to form a modulated optical signal, an optical time delay means for time delaying at least parts of the modulated optical signal by a plurality of incremental time delays, to produce outputs from the optical time delay means which comprises a plurality of modulated optical signals delayed in time with respect to one another and each substantially identical in profile to at least part of the individual pulse, a converting means for converting the modulated optical signals output from the optical time delay means into electrical signals, and a digital sampling means for digitally sampling the electrical signals output from the converting means.

2. A device according to claim 1 wherein the differences between successive incremental time delays are greater than the duration of the incident individual pulse.

3. A device according to claim 2 wherein the optical time delay means comprises a recirculating loop of optical fibre, and optical coupling means are provided to couple the modulated optical signal into the recirculating loop and to couple at least a portion of the modulated optical signal out of the recirculating loop.

4. A device according to claim 1 wherein the optical time delay means comprises at least first and second pluralities of optical fibres arranged in series, a first coupling means for directing the modulated optical signal into every input end of the first plurality of optical fibres and further coupling means for directing into every input end of successive pluralities of optical fibres the pulses from every output end of a preceding plurality of optical fibres.

5. A device according to claim 1 wherein the optical time delay means comprises a plurality of optical fibres of different incremental lengths and a coupling means for directing the modulated optical signal into the input ends of every fibre so that they are all illuminated by the modulated optical signal.

6. A device according to claim 1 wherein the differences between successive incremental time delays are constant.

7. A device according to claim 1 wherein the light source is a substantially coherent light source.

8. A device according to claim 1 wherein the light source is a semiconductor laser.

9. A device according to claim 8 wherein the output of the semiconductor laser is internally modulated with the pulse.

10. A device according to claim 1 wherein the output of the light source is externally modulated with the pulse.

11. A device according to claim 1 wherein the converting means comprises one wide bandwidth photo-diode.

12. A device according to claim 1 wherein the converting means comprises a plurality of wide bandwidth photo-diodes.

13. A device according to claim 1 wherein the digital sampling means comprises a digital sampling circuit.

14. A device according to claim 1 wherein the digital sampling means comprises a plurality of digital sampling circuits.

15. A device according to claim 14 wherein the electrical signals from the converting means are split and the resulting electrical signals are input into separate digital sampling circuits.

16. A device according to claim 14 wherein the digital sampling means comprises a pulse generator for generating trigger pulses, a plurality of digital sampling circuits and a corresponding number of delay means for transmitting the trigger pulse to respective digital sampling circuits in such a way that each digital sampling circuit is triggered by a trigger pulse at a different time.

17. A device according to claim 16 wherein the digital sampling means comprises an optical pulse generator for generating optical pulses, a plurality of digital sampling circuits and a corresponding plurality of optical fibre delay lines of different lengths for transmitting the optical pulses to respective digital sampling circuits to trigger said circuits.

18. A process for converting wide bandwidth short duration individual pulses of electro-magnetic radiation into a form that can be more readily digitally sampled, comprising the steps of:
   a) producing optical radiation,
   b) receiving a wide bandwidth short duration individual pulse of electro-magnetic radiation,
   c) modulating the optical radiation with the pulse to form a modulated optical signal, and
   d) time-delaying at least parts of the modulated optical signal by a plurality of incremental time delays, to produce a plurality of modulated optical signals delayed in time with respect to one another and each having a profile identical to at least part of that of the incident individual pulse, wherein said time-delaying step includes modulating an impulse onto the optical radiation at a predetermined time before the beginning of the modulated optical signal.

19. A process according to claim 18 wherein the differences between successive incremental time delays are greater than the duration of the individual pulse.

20. A process according to claim 18 wherein the differences between successive time delays are constant.

21. A process according to claim 18 which additionally includes the step of;
   e) converting the modulated optical signals output that it time delayed into electrical signals.

22. A device for converting wide bandwidth, short duration individual pulses of electro-magnetic radiation into a form more readily digitally sampled, said device comprising,
   a source of optical radiation,
   a receiving means for receiving a wide bandwidth, short duration pulse of electromagnetic radiation,
   a modulating means, responsive to said optical radiation and said receiving means, for modulating the optical radiation with the pulse to form a modulated optical signal, and
   an optical time delay means for time delaying at least parts of the modulated optical signal by a plurality of incremental time delays, to produce outputs from the optical time delay means which comprises a plurality of modulated optical signals delayed in time with respect to one another and each substantially identical in profile to at least part of the individual pulse, wherein the device additionally comprises a triggering means, responsive to said modulated optical signal, for causing an impulse to be modulated onto the optical radiation at a predetermined time before the beginning of the modulated optical signal.

23. A device for converting wide bandwidth, short duration individual pulses of electro-magnetic radiation into a form more readily digitally sampled, said device comprising,
   a source of optical radiation,
   a receiving means for receiving a wide bandwidth, short duration pulse of electro-magnetic radiation,
   a modulating means, responsive to said optical radiation and said receiving means, for modulating the optical radiation with the pulse to form a modulated optical signal, and
   an optical time delay means for time delaying at least parts of the modulated optical signal by a plurality of incremental time delays, to produce outputs from the optical time delay means which comprises a plurality of modulated optical signals delayed in time with respect to one another and each substantially identical in profile to at least part of the individual pulse,
   a converting means for converting the modulated optical signals output from the optical time delay means into electrical signals, said converting means comprises a plurality of wide bandwidth photo-diodes, wherein the electrical signals from the wide bandwidth photo-diodes are combined.

24. A process for converting wide bandwidth short duration individual pulses of electro-magnetic radiation into a form that can be more readily digitally sampled, comprising the steps of:
   a) producing optical radiation,
   b) receiving a wide bandwidth short duration individual pulse of electro-magnetic radiation,
   c) modulating the optical radiation with the pulse to form a modulated optical signal, and
   d) time-delaying at least parts of the modulated optical signal by a plurality of incremental time delays, to produce a plurality of modulated optical signals delayed in time with respect to one another and each having a profile identical to at least part of that of the incident individual pulse,
   e) converting the modulated optical signals output that is time delayed into electrical signals, and
   digitally sampling the electrical signals.

* * * * *